United States Patent [19]

Juskey et al.

[11] Patent Number: 5,438,216
[45] Date of Patent: Aug. 1, 1995

[54] LIGHT ERASABLE MULTICHIP MODULE

[75] Inventors: Frank J. Juskey; Anthony B. Suppelsa; Dale W. Dorinski, all of Coral Springs, Fla.

[73] Assignee: Motorola, Inc., Schaumburg, Ill.

[21] Appl. No.: 937,017

[22] Filed: Aug. 31, 1992

[51] Int. Cl.⁶ .................. H01L 77/14; H01L 31/00; H01L 23/02; H01L 23/12
[52] U.S. Cl. .................... 257/434; 257/433; 257/680; 257/681; 257/704; 257/707
[58] Field of Search ............ 357/72, 74, 80, 81; 257/681, 778, 723, 787, 796, 433, 434, 680, 700, 704, 707; 361/403, 417, 420; 174/262, 264

[56] References Cited

U.S. PATENT DOCUMENTS

| | | |
|---|---|---|
| 4,644,384 | 2/1987 | Charoensakvirochana et al. ............ 357/74 |
| 4,694,120 | 9/1987 | Accou ............ 174/68.5 |
| 4,707,725 | 11/1987 | Ito ............ 357/72 |
| 4,825,284 | 4/1989 | Soga et al. ............ 357/80 |
| 4,827,328 | 5/1989 | Ozawa et al. ............ 357/80 |
| 4,843,036 | 6/1989 | Schmidt et al. ............ 437/224 |
| 5,046,161 | 9/1991 | Takada ............ 357/69 |
| 5,088,007 | 2/1992 | Missele ............ 361/386 |
| 5,138,433 | 8/1992 | Hiruta ............ 357/72 |
| 5,159,433 | 10/1992 | Kazami et al. ............ 257/681 |
| 5,177,669 | 1/1993 | Juskey et al. ............ 257/675 |
| 5,200,810 | 4/1993 | Wojnarowski et al. ............ 257/668 |

FOREIGN PATENT DOCUMENTS

| | | |
|---|---|---|
| 59-113656 | 6/1984 | Japan . |
| 120884 | 7/1984 | Japan ............ 257/778 |
| 02097255 | 4/1991 | Japan . |
| 03104152 | 5/1991 | Japan . |

OTHER PUBLICATIONS

IBM TDB vol. 27 No. 12 May 1985 "Field-Modifiable Electronic Devices".

*Primary Examiner*—Robert P. Limanek
*Assistant Examiner*—Teresa M. Arroyo
*Attorney, Agent, or Firm*—Dale W. Dorinski

[57] ABSTRACT

A multichip circuit package is formed for use with an EPROM chip. The active circuitry on the EPROM die surface is revealed. An EPROM die (14) is mounted on an insulating substrate (10). The active circuitry (15) on the die is connected to a conductive circuit pattern (13) on the substrate by wire bonds (16) between the die and the conductive circuit pattern. A second integrated circuit die (20) is also mounted on the substrate and electrically connected to the conductive circuit pattern by wire bonds. A plastic material (50) is then molded to encapsulate the perimeter (18) of the EPROM and the associated thin wires, the entire second integrated circuit die and it's associated thin wires, at least a portion of the conductive circuit pattern, and portions of the insulating substrate. The plastic material is formed so as to expose the active circuitry on the face of the EPROM.

23 Claims, 6 Drawing Sheets

LIGHT ERASABLE MULTICHIP MODULE

CROSS REFERENCE TO RELATED APPLICATIONS

This application is related to application Ser. No. 844,015 entitled "Molded Ring Integrated Circuit Package," filed Feb. 28, 1992, and assigned to Motorola, Inc.

TECHNICAL FIELD

This invention relates generally to a package for an electronic device, and more particularly to a multichip integrated circuit package containing circuitry that may be erased by light.

BACKGROUND

In the art of fabricating integrated circuit packages, the continuing goals are to make the circuit and the associated package smaller, more dense, more thermally efficient, and lower cost. Numerous packaging methodologies have been proposed to address these and other areas of concern. The increasing number of integrated circuit pads correspondingly increases the size of the packages and adds to the cost of the end product. Because the size of the package is an exponential function of the number of leads emanating from the die, increasing density rapidly and dramatically increases 1;he package size. One of the approaches to this problem has been to place multiple die on a single substrate, and then provide the die-to-die interconnections on the substrate. This technology is known as tile multichip module.

Multichip modules containing eraseable programmable read-only memory (hereinafter called EPROM) die which can be erased by an ultraviolet (UV) light rays consist of one or more EPROM chips mounted on a common substrate. Packaging the multichip module creates significant problems with EPROM die. The multichip module and the chips are covered with a cap to physically protect them from deleterious effects of the environment. The cap may be made entirely from a UV light transmitting material, but is typically made from a UV opaque material, such as ceramic, metal, or plastic. Regardless of the material used, the cap must be capable of transmitting UV light to the EPROM. Because of these complex and costly covers, conventional multichip EPROM packages suffer from a number of disadvantages, such as:

(1) UV light permeable resins are rather expensive, and even though they provide sufficient UV transmittance, it would be desirable to eliminate them.
(2) The difference in thermal expansion coefficients between the base material, the cover, and the UV light permeable resin sometimes generates cracks in the package.
(3) The complex covers are relatively heavy and bulky, thereby restricting the packaging density on a printed circuit board.
(4) Assembly requires substantial time.
(5) Cracks can be formed in the package because ceramic covers are quite fragile with regard to shock.
(6) The need to add a separate cover and UV window to the cover creates a finished assembly which is larger than desired. A package with less wasted space in the vertical direction would be desirable.
(7) The complex covers are expensive, thereby increasing the cost of the finished package.

Thus, a continuing goal in the integrated circuits art is a package design that addresses these problems satisfactorily in an arrangement that can be reliably manufactured at a low cost. Such a package has not previously been in existence for multichip EPROM modules.

SUMMARY OF THE INVENTION

Briefly, according to the invention, there is provided a multichip circuit package, formed to reveal the active circuitry on a die surface. A first integrated circuit die is mounted on an insulating substrate. The active circuitry on the die is connected to a conductive circuit pattern on the substrate by thin wires between the die and the conductive circuit pattern. Additional integrated circuit dies are also mounted on the substrate and electrically connected to the conductive circuit pattern by thin wires. A plastic material is then molded to encapsulate the perimeter of the first integrated circuit die and the associated thin wires, the entire additional integrated circuits and their associated thin wires, at least a portion of the conductive circuit pattern, and portions of the insulating substrate. The plastic material is formed so as to expose the active circuitry on the face of the first die.

In an alternate embodiment, the first die is mechanically mounted to the insulating substrate with the upper surface of the die facing the substrate. The active circuitry is aligned over an opening in the substrate to reveal the active circuitry. The die is flip chip bonded to the conductive circuit pattern. A second integrated circuit die is also mounted on the substrate and electrically connected to the conductive circuit pattern.

In a further embodiment, the flip chip bonded dies are encapsulated with plastic molding material, the plastic arranged to reveal the active circuitry on the first die.

DETAILED DESCRIPTION OF THE PREFERRED EMBODIMENT

Figure 1:
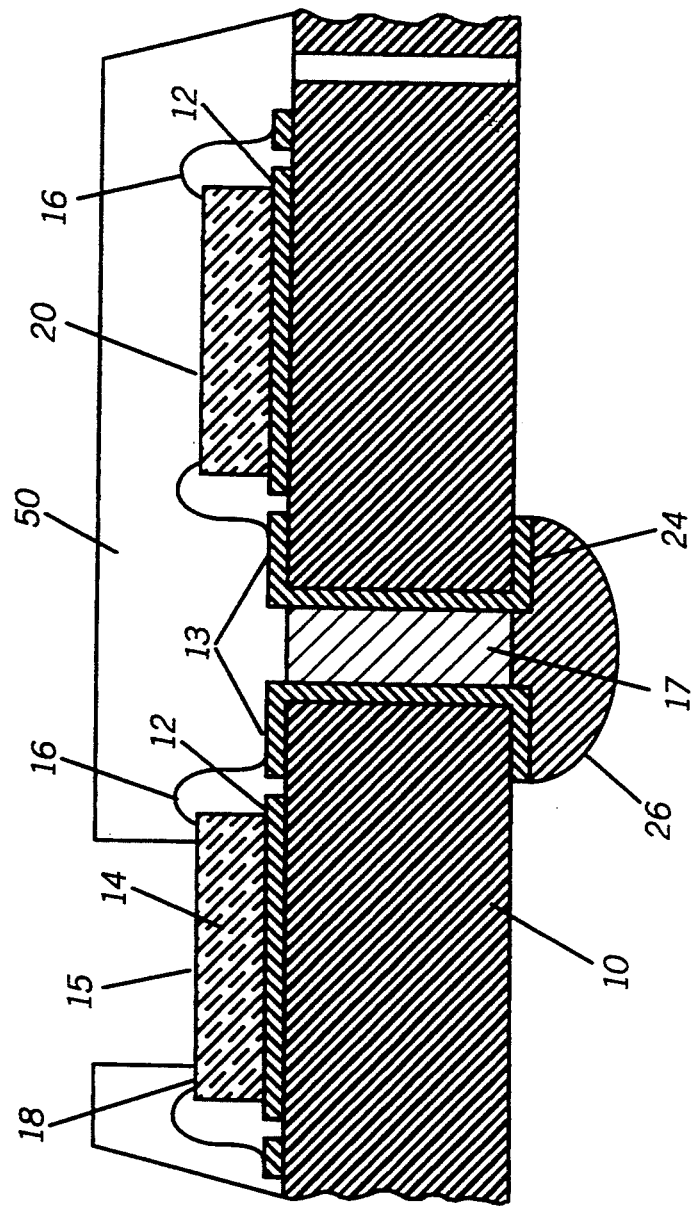
FIG. 1 is a cross-sectional view of an integrated circuit package in accordance with the invention, as viewed through section 1—1 of FIG. 2.

The present invention will now be described in more detail with reference to various figures, in which like reference numerals are carried forward. The reader will find in FIG. 1 a cross-sectional view of the interior portions of a multichip electronic package in accordance with the invention, and an isometric view in FIGS. 2 and 3. An insulating substrate 10 is made of a material such as a printed circuit board made from glass-filled epoxy resin. Other suitable substrate materials such as ceramics and other types of rigid and flexible printed circuit boards may also be used with efficacy. The substrate 10 has at least two chip mounting portions 12 and a conductive circuitry pattern 13 on the main surface thereof. The chip mounting portion 12 is defined as one portion of the conductive circuitry pattern 13. Another portion of the pattern 13 is adjacent to the chip mounting portion 12. The pattern 13 may be connected to a solder pad 24 by means of a plated through hole 17. The solder pad 24 may contain a solder ball 26 or may be extended to provide attachment for leads to be used in soldering the multichip module to a main printed circuit board. An EPROM chip 14 is mounted on one of the chip mounting portions 12 by any one of a number of conventional means such as eutectic die bonding, various alloys of solder, or by using a conductive epoxy. In the preferred embodiment, a conductive epoxy is used.

The EPROM chip 14 is mounted in such a manner that the active circuitry 15 of the EPROM chip faces upward. The EPROM chip 14 has active circuitry 15 in a central area coveting most of the upper face. Surrounding the active circuitry 15 is a perimeter 18 which contains a plurality of wire bond pads. Each of the wire bond pads of the EPROM chip 14 is connected to a portion of the conductive circuitry pattern 13 with thin metal wires 16.

In addition to the EPROM chip 14 having been mechanically mounted to the chip mounting portion 12 and electrically connected to the conductive circuitry pattern 13, other die or chips 20 are placed onto the substrate. These die may also be EPROM types, or they may be conventional semiconductor devices. In either case, the die or additional components are added in conventional manner as dictated by the design of the multichip module.

The entire assembly is then placed in a molding cavity in order to encapsulate the perimeter 18 of the EPROM chip 14, the thin wires 16, the additional chips 20, at least portions of the conductive circuitry pattern 13, and at least portions of the substrate 10. A plastic molding material 50 is injected or poured into the mold cavity and cured or set. The mold cavity is configured so that an opening in the plastic molding material 50 is formed to keep the active circuitry 15 exposed to the environment. One method of performing this is now described.

Figure 4:
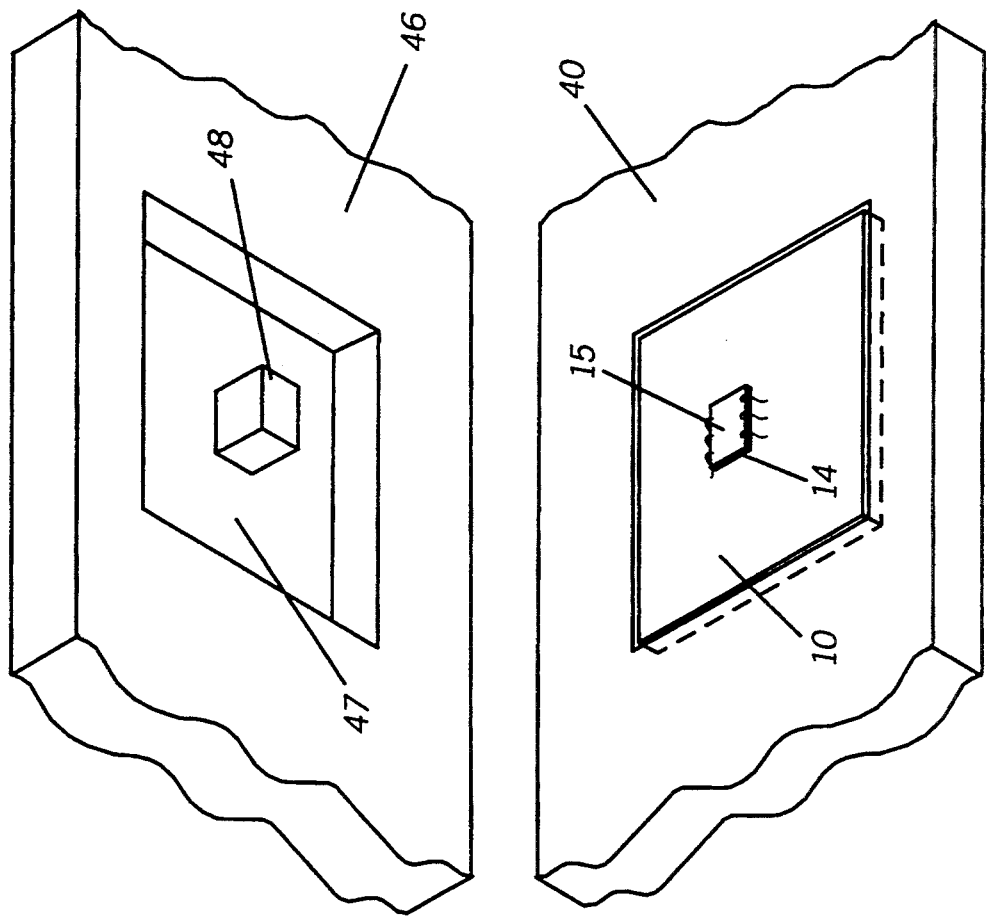
FIG. 4 is an isometric view of one embodiment of a mold for fabricating the integrated circuit package in accordance with the invention.
Figure 5:
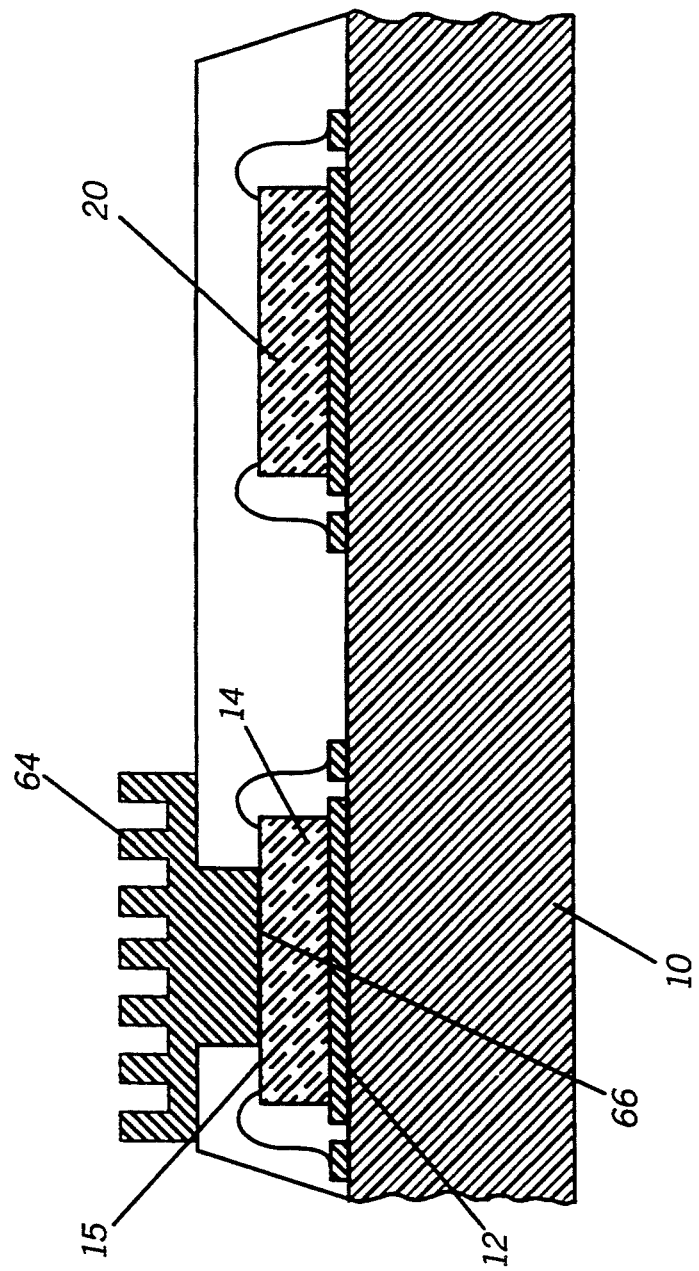
FIG. 5 is a cross-sectional view of an integrated circuit package having heat sinks in accordance with the invention.

Referring now to FIG. 4, the substrate 10 rests upon a bottom half 40 of a mold. The upper half 46 of the mold corresponds to the bottom half 40 and has a pedestal or member 48 which comes to rest upon the active circuitry 15 of the EPROM chip 14. In the preferred embodiment, the second member 48 consists of an elastomeric material. The second member 48 protrudes beyond the plane of the surface of the upper half 46 so that when the upper half is placed on the bottom half 40 and the mold is closed, the elastomeric second member 48 bears upon the active surface 15 of the EPROM chip 14 and is compressed to form a tight seal. A plastic material such as a transfer molding compound, is then injected or poured into the space 47 in the mold in order to encapsulate portions of the multichip module. During the molding operation, the elastomeric member 48 presses or bears against the active surface 15 of the die in order to prevent flashing of the molding compound across the die surface. Numerous elastomers may be used for this purpose, however, in a transfer-molding process, the elastomer must be a high-temperature material. A copolymer material made of a blend of styrene-butadiene rubber/styrene-based thermoplastic elastomer/silicone rubber has been found to be especially suitable for use in transfer molding operations. A suitable styrene-based thermoplastic elastomer is KRATON ® from Shell Chemical. Other elastomers suitable for high temperature use, such as silicone rubbers, may be substituted for the above mentioned copolymer blend. The plastic material 50 may be applied by means other than by transfer molding. For example, by casting, injection molding, reaction injection molding, or using other thermoset materials.

Figure 2:
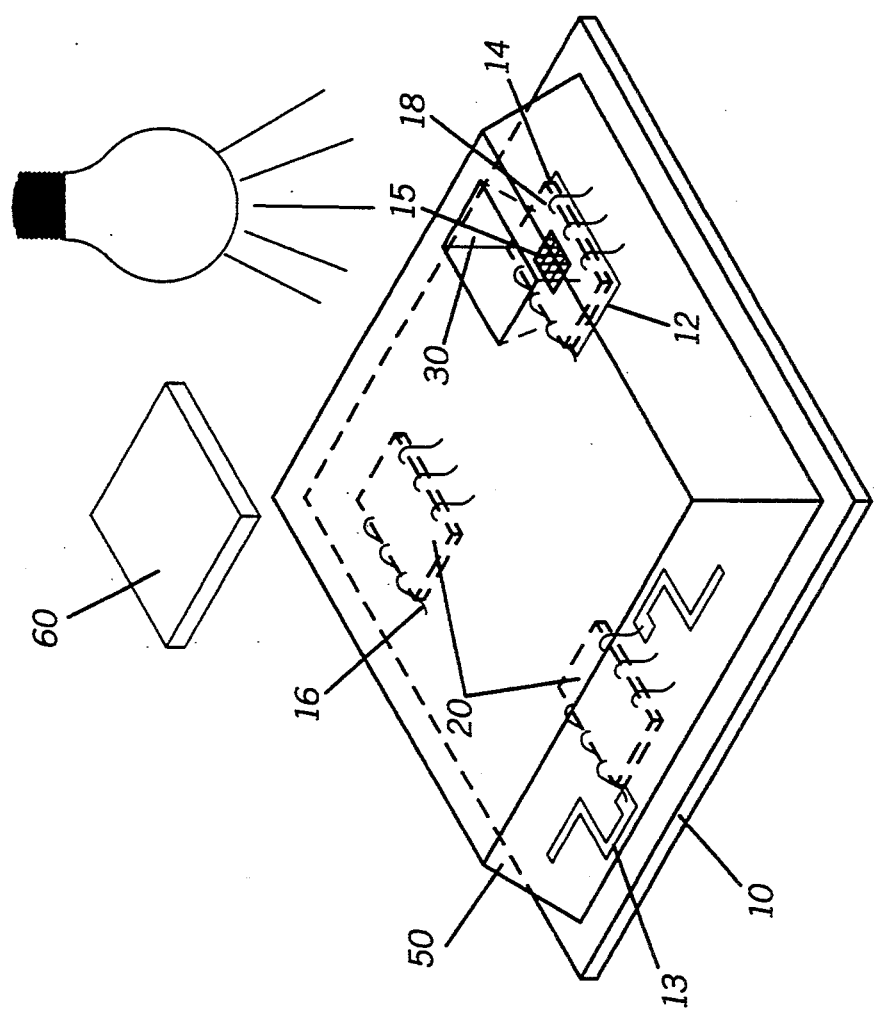
FIG. 2 is an isometric view of an integrated circuit package in accordance with the invention.
Figure 3:
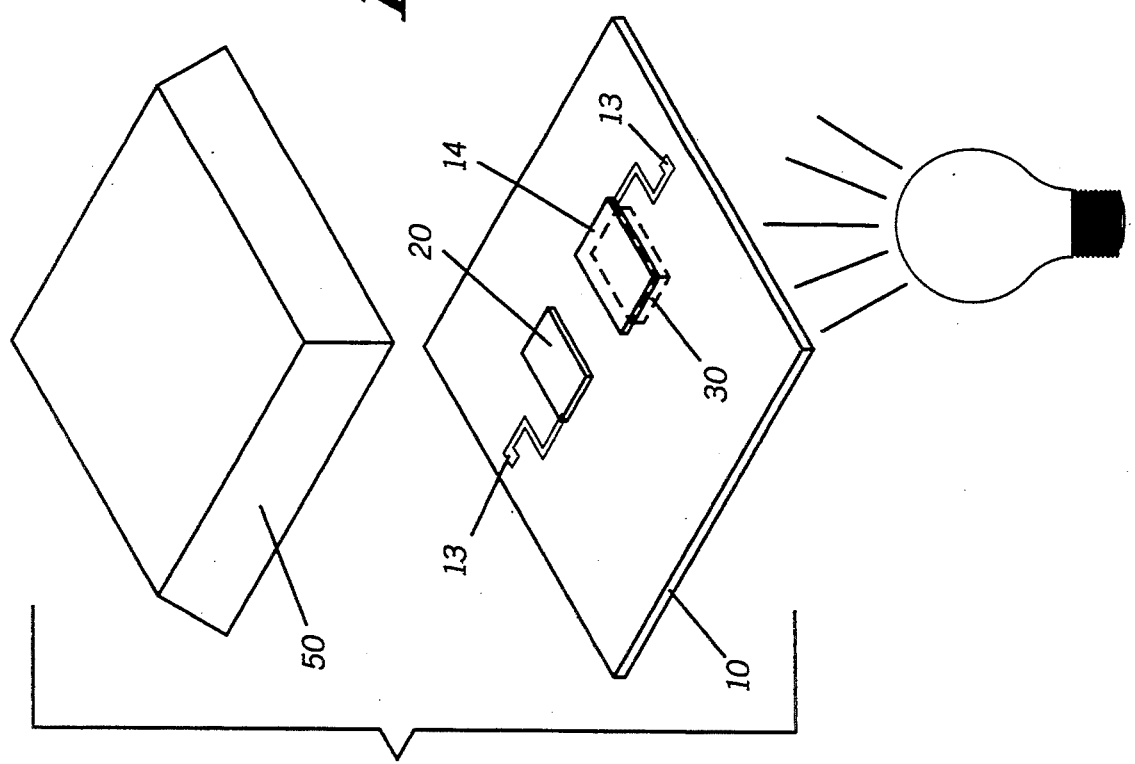
FIG. 3 is an isometric view of an alternate embodiment of the invention.

Referring now to FIG. 2, it can be seen that the thin wires 16, portions of the conductive circuit pattern 13, portions of the substrate 10, the chip mounting portion 12, the perimeter 18, and the additional chips 20 have all been encapsulated or completely encased in the plastic molding material 50. The arrangement of the mold further provides that the active circuitry 15 of the EPROM chip 14 is free of plastic molding material 50 and is revealed or exposed to the environment. The plastic molding material 50 protects the perimeter of the EPROM chip 14 encasing only the interconnect portion of the chip and the wirebonds, in contrast to the other chips where the entire die is encapsulated by the molding material. The instant invention eliminates the molding material from the surface of the active circuitry of the EPROM chips in the multichip module, thereby reducing the amount of molding material used and also reducing the attendant cost of the multichip package.

By keeping the central portion or active circuitry area 15 of the die open, the active circuitry 15 may be erased, for example, by UV light and then reprogrammed. After erasing the memory of the die, a cover 60 may optionally be added, which rests upon the top surface of the molded plastic material 50. The cover 60 protects the surface of the die 12 from further inadvertent erasing by stray environmental light. The cover 60 may be a rigid cover that is adhesively bonded to the plastic molding material 50 or it may be any number of configurations that serve to provide the same function. For example, in the simplest configuration, the cover 60 is a small dot of plastic film or paper with a pressure sensitive adhesive so as to allow easy cover removal and replacement.

Figure 6:
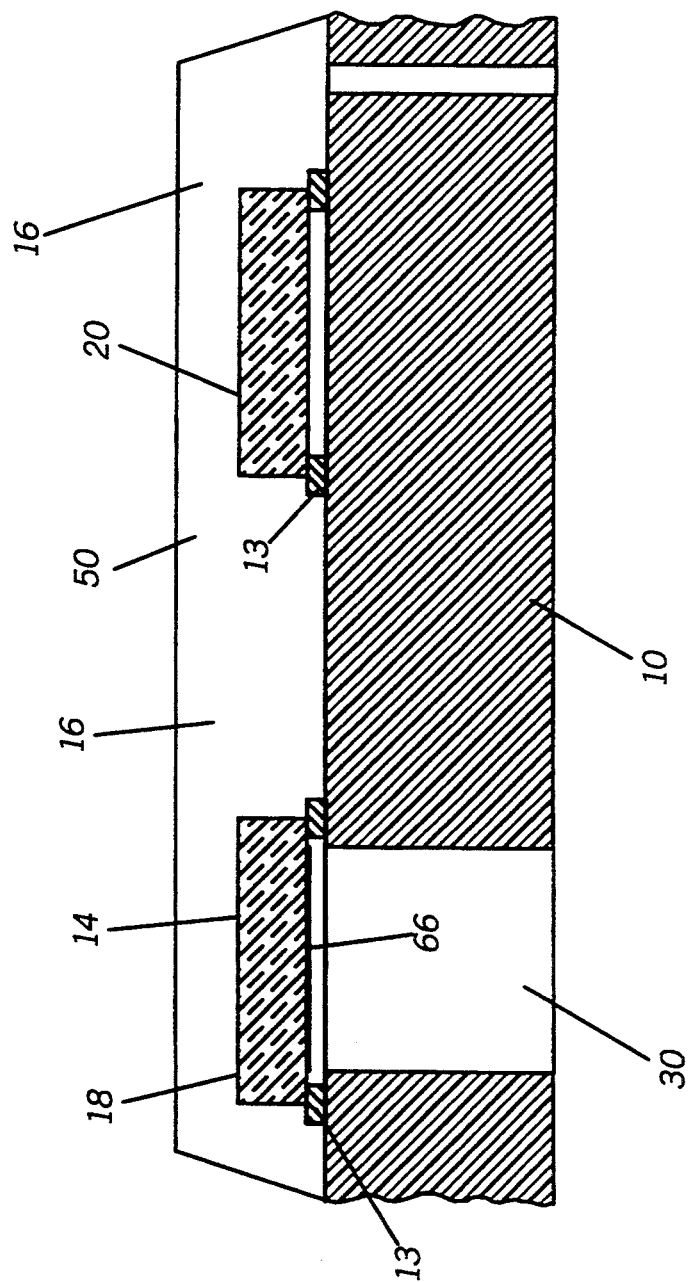
FIG. 6 is a cross-sectional view of an alternate embodiment of an integrated-circuit package in accordance with the invention.

When the EPROM chip 14 is open to the environment, heat is more rapidly dissipated from the chip as compared to being encased in plastic. Thermal performance can also be enhanced by placing a heat sink 64 such that the heat sink is in contact with the active circuitry 15 of the die as shown in FIG. 6. The active circuitry 15 is protected from environmental damage, corrosion, and other physical damage by a glass passivation layer 66 that is conventionally applied on the die during the semiconductor manufacturing process. A polymeric die coating, such as a silicone coating or gel, may also be applied over the active circuitry for protection. The heat sink 64 may also be formed so as to serve as a cover for the multichip module, thereby further protecting the EPROM chip 14 from physical damage.

In an alternate embodiment of the invention, the EPROM chip 14 and/or the additional chips 20 may be flip chip or TAB bonded to the substrate 10. In such a case, the aforementioned active circuitry is mounted face down as opposed to face up. The substrate 10 now has an opening 30 to allow the active circuitry 15 to be exposed to light. The EPROM chip 14 is placed so that the active circuitry 15 is aligned with the opening 30, and the chip is bonded to the conductive circuitry pattern 13. Additional chips 20 may be flip chip bonded or conventionally bonded, as desired. If all the chips are flip chip bonded, it is not necessary to encapsulate the multichip module. The EPROM chip 14 may now be erased by exposing the underside of the substrate 10 to UV light. If desired, an encapsulant such as a glob top encapsulant or transfer molded encapsulant may be added over the chips 14 and 20 in order to provide a higher degree of environmental protection. It should be noted that if an encapsulant is added, it must be applied in such a manner so as to not cover the active circuitry 15 of the EPROM chip 14.

Many modifications may be made in the structure and process without departing from the scope of the claimed invention. A multichip module for EPROMs has now been provided, which provides advantages of increased thermal dissipation, reduced cost, increased performance, and improved reliability.

What is claimed is:

1. A multichip integrated circuit package, comprising:
   an insulating substrate having at least two die mounting portions and a conductive circuit pattern thereon, the conductive pattern electrically connected to solder pads on an opposite side of the substrate by means of conductive vias;
   a first integrated circuit die having an upper surface including a perimeter portion and a central portion comprising light erasable active circuitry;
   said first integrated circuit die mechanically mounted on one of said die mounting portions and electrically connected to said conductive circuit pattern by thin wires;
   a second integrated circuit die mechanically mounted on said other die mounting portion and electrically connected to said conductive circuit pattern by thin wires;
   plastic molding material formed to encapsulate the entire second integrated circuit die and associated thin wires, said first integrated circuit perimeter portion and associated thin wires, at least a portion of said conductive circuit pattern, and portions of said insulating substrate; and
   an opening formed in said plastic molding material to reveal said first integrated circuit die active circuitry.

2. The multichip integrated circuit package as described in claim 1, wherein said plastic molding material is opaque.

3. The multichip integrated circuit package as described in claim 1, wherein said insulating substrate is ceramic or a printed circuit board.

4. The multichip integrated circuit package as described in claim 1, wherein said first and second integrated circuit die are electrically interconnected via the conductive circuit pattern.

5. The multichip integrated circuit package as described in claim 1, wherein said second integrated circuit die comprises a die having light erasable active circuitry.

6. The multichip integrated circuit package as described in claim 1, wherein said first integrated circuit die is passivated with a glass or polymer coating.

7. The multichip integrated circuit package as described in claim 1, wherein said plastic material is formed by transfer molding.

8. The multichip integrated circuit package as described in claim 1, further comprising a heat sink mounted on said first integrated circuit die upper surface.

9. The multichip integrated circuit package as described in claim 1, further comprising a cover said opening to provide physical protection to said revealed active circuitry.

10. The multichip integrated circuit package as described in claim 1, further comprising solder bumps on the solder pads.

11. A multichip integrated circuit package, comprising:
    an insulating substrate having an opening, a die mounting portion, and a conductive circuit pattern thereon, the conductive pattern electrically connected to solder pads on an opposite side of the substrate by means of conductive vias;;
    a first integrated circuit die having an up,per surface including a perimeter portion having a plurality of interconnect pads and a central portion comprising light erasable active circuitry;
    said first integrated circuit die mechanically mounted to said insulating substrate with said upper surface facing said substrate, said active circuitry aligned over said opening to reveal said active circuitry, said interconnect pads flip chip bonded to said conductive circuit pattern; and
    a second integrated circuit die mechanically mounted on said die mounting portion and electrically connected to said conductive circuit pattern.

12. The multichip integrated circuit package as described in claim 11, wherein said second integrated circuit die is flip chip bonded.

13. The multichip integrated circuit package as described in claim 11, wherein said second integrated circuit die is wire bonded.

14. The multichip integrated circuit package as described in claim 11, further comprising plastic molding material formed to encapsulate said first and second integrated circuit die, at least a portion of said conductive circuit pattern, and portions of said insulating substrate, said plastic molding material formed so as to reveal said active circuitry on said first integrated circuit die.

15. The multichip integrated circuit package as described in claim 11, wherein said plastic molding material is opaque.

16. The multichip integrated circuit package as described in claim 11, wherein said insulating substrate is ceramic or a printed circuit board.

17. The multichip integrated circuit package as described in claim 11, wherein said first and second integrated circuit die are electrically interconnected via the conductive circuit pattern.

18. The multichip integrated circuit package as described in claim 11, wherein said first integrated circuit die is passivated with a glass or polymer coating.

19. The multichip integrated circuit package as described in claim 11, further comprising a heat sink mounted on said first integrated circuit die upper surface.

20. The multichip integrated circuit; package as described in claim 11, further comprising a cover to provide physical protection to said revealed active circuitry.

21. The multichip integrated circuit package as described in claim 11, wherein said plastic molding material is glob top encapsulant.

22. The multichip integrated circuit package as described in claim 11, further comprising solder bumps on the solder pads.

23. A multichip integrated circuit package, comprising:
- a printed circuit board base having at least two die mounting portions and a conductive circuit pattern thereon, the conductive circuit pattern electrically connected to solder pads on an opposite side of the substrate by means of conductive vias, each solder pad having a solder bump attached thereto;
- a first integrated circuit die having an upper surface including a perimeter portion and a central portion comprising light erasable active circuitry;
- said first integrated circuit die mechanically mounted on one of said die mounting portions, thin wires connecting said first integrated circuit die perimeter portion to said conductive circuit pattern;
- a second integrated circuit die mechanically mounted on said other die mounting portion, thin wires electrically connecting said second integrated circuit die to said conductive circuit pattern;
- plastic molding material transfer molded to encapsulate said first integrated circuit perimeter portion and associated thin wires, all of said second integrated circuit die and associated thin wires, at least a portion of said conductive circuit pattern, and portions of said insulating substrate;
- an opening formed in said plastic molding material to reveal said first integrated circuit die active circuitry; and
- a removable cover over said opening to provide physical protection to said revealed active circuitry.

* * * * *

UNITED STATES PATENT AND TRADEMARK OFFICE
CERTIFICATE OF CORRECTION

PATENT NO. : 5,438,216
DATED : August 1, 1995
INVENTOR(S) : Juskey, et al

It is certified that error appears in the above-indentified patent and that said Letters Patent is hereby corrected as shown below:

Column 6, claim 11, line 15, delete "up,per" and insert therefor --upper--.

Column 6, claim 20, line 59, after "circuit" delete ";".

Signed and Sealed this

Fourth Day of June, 1996

Attest:

BRUCE LEHMAN

*Attesting Officer*  *Commissioner of Patents and Trademarks*